United States Patent
Thomas

[19]
[11] Patent Number: 6,163,236
[45] Date of Patent: Dec. 19, 2000

[54] TWIN DUAL MODE FILTERS WITH REFLECTORS BETWEEN TRANSDUCERS BEING ELECTRICALLY CONNECTED BETWEEN DMS TRACKS

[75] Inventor: Baier Thomas, München, Germany

[73] Assignee: Siemens Matsushita Components GmbH & Co., Munich, Germany

[21] Appl. No.: 09/254,826

[22] PCT Filed: Aug. 28, 1997

[86] PCT No.: PCT/DE97/01878

§ 371 Date: Mar. 12, 1999

§ 102(e) Date: Mar. 12, 1999

[87] PCT Pub. No.: WO98/12807

PCT Pub. Date: Mar. 26, 1998

[30] Foreign Application Priority Data

Sep. 19, 1996 [DE] Germany ............... 196 38 455

[51] Int. Cl.[7] .................................................. H03H 9/64
[52] U.S. Cl. ...................... 333/195; 333/196; 310/313 D
[58] Field of Search ...................... 333/193–196; 310/313 R, 313 B, 313 C, 313 D

[56] References Cited

U.S. PATENT DOCUMENTS 6,060,964   5/2000   Baier et al. .......................... 333/193

FOREIGN PATENT DOCUMENTS 0 545 672 A1   6/1993   European Pat. Off. .
4 227 362 A1   2/1994   Germany .
4 439 489 C1   1/1996   Germany .
8-316784      11/1996   Japan .

*Primary Examiner*—Robert Pascal
*Assistant Examiner*—Barbara Summons
*Attorney, Agent, or Firm*—Schiff, Hardin, & Waite

[57] ABSTRACT

Twin dual mode filter with DMS filters have an input and output transducer (2; 12) per DMS track (A, B) within reflectors (3, 3) and further reflectors (7, 11) between the transducers that are respectively interconnected to one of the transducers. The reflectors (7, 11) of the input or, respectively, output side are respectively connected to one another via interconnects (8, 8). The DMS tracks (A, B) are frequency-shifted relative to one another such that the high-frequency resonance of the low-frequency track (B) falls onto the low-frequency resonance of the high-frequency track (A).

16 Claims, 3 Drawing Sheets

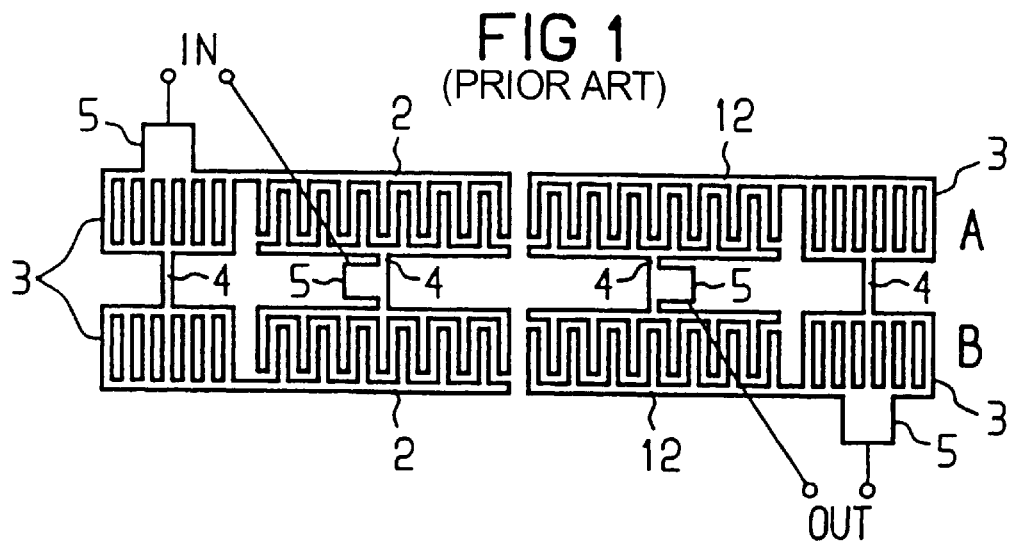
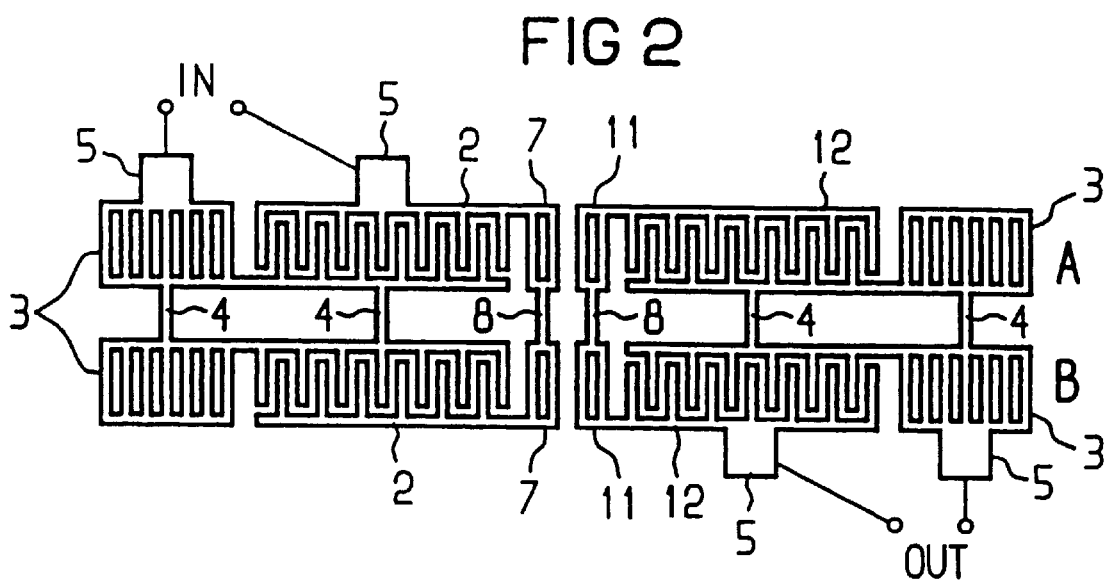

TWIN DUAL MODE FILTERS WITH REFLECTORS BETWEEN TRANSDUCERS BEING ELECTRICALLY CONNECTED BETWEEN DMS TRACKS

BACKGROUND OF THE INVENTION

Longitudinal mode resonator filters, also called dual mode filters or DMS filters, are referred to below as surface wave filters referenced OFW filters that comprise two normal finger transducers arranged within reflectors according to the schematic plan view according to FIG. 1 and that are effective as input or, respectively, output transducer 2, 12. They have two-pole filter characteristics. When two DMS tracks A and B that are frequency-shifted relative to one another such that the high-frequency resonance of the low-frequency track B falls onto the low-frequency resonance of the high-frequency track A are interconnected as shown in FIG. 1, then what is referred to as a twin dual mode filter is obtained, this being distinguished by three-pole filter characteristics and by an enhanced edge steepness compared to the single track.

Given the filter structure according to FIG. 1, a respective bond wire at the side of the filter input and filter output IN or, respectively, OUT must be conducted at least across one connecting line, across one of the DMS tracks A, B in the worst case. This requires additional chip or, respectively, substrate area for the bond pads 5 connected to the transducers 2, 12 via interconnects 4 between the DMS tracks A, B and complicates the fabrication of such a filter.

It is also disadvantageous that the impedances of the filter can be made arbitrarily smaller by enlarging the aperture since disturbing transverse modes occur in this case.

Given symmetrical operation of the twin dual mode filter, over and above this, no optimum suppression of the electrical crosstalk is achieved since the geometry is not symmetrical.

When the DMS tracks are not optimally aligned relative to one another with respect to the resonant frequencies, then increased amplitude and group running time distortions occur in the filter transmission band. Such a de-adjustment is unavoidable in mass production due to the scatters of the manufacturing parameters and the inhomogeneities on the wafer.

SUMMARY OF THE INVENTION

The present invention is based on the object of specifying a twin dual mode filter according to the species initially sited wherein at least the first-cited problem is solved, i.e. a crossing-free layout is created for the bond wires.

In general terms the present invention is a twin dual mode filter, having two interconnected DMS filters with two normal finger transducers as input or, respectively, output transducers per DMS track within reflectors. The DMS tracks are frequency-shifted relative to one another such that the high-frequency resonance of the low-frequency track falls onto the low-frequency resonance of the high-frequency track. Two reflectors respectively interconnected with one of the transducers are arranged between input and output transducers of each DMS track. The reflectors of the input or, respectively, output side are respectively electrically connected to one another via interconnects.

Advantageous developments of the present invention are as follows.

The reflectors are replaced by fingers having a suitable width.

Two twin dual mode filters are connected in parallel.

Two twin dual mode filters have series-connected outputs.

Two twin dual mode filters have inputs connected in series and outputs connected parallel.

Ohmic resistors are connected into the leads to the input and output transducers.

Two reflectors respectively interconnected with one of the transducers and having fingers inclined relative to the propagation direction of the surface waves are arranged between input and output transducers of the low-frequency DMS track.

Terminal elements of the filter input and filter output are applied intersection-free onto the substrate surfaces of the DMS tracks facing away from one another.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 depicts a prior art longitudinal mode resonator filter;

FIG. 2 an embodiment of an inventive twin dual mode filter in a schematic plan view;

DESCRIPTION OF THE PREFERRED EMBODIMENTS

Figure 3:
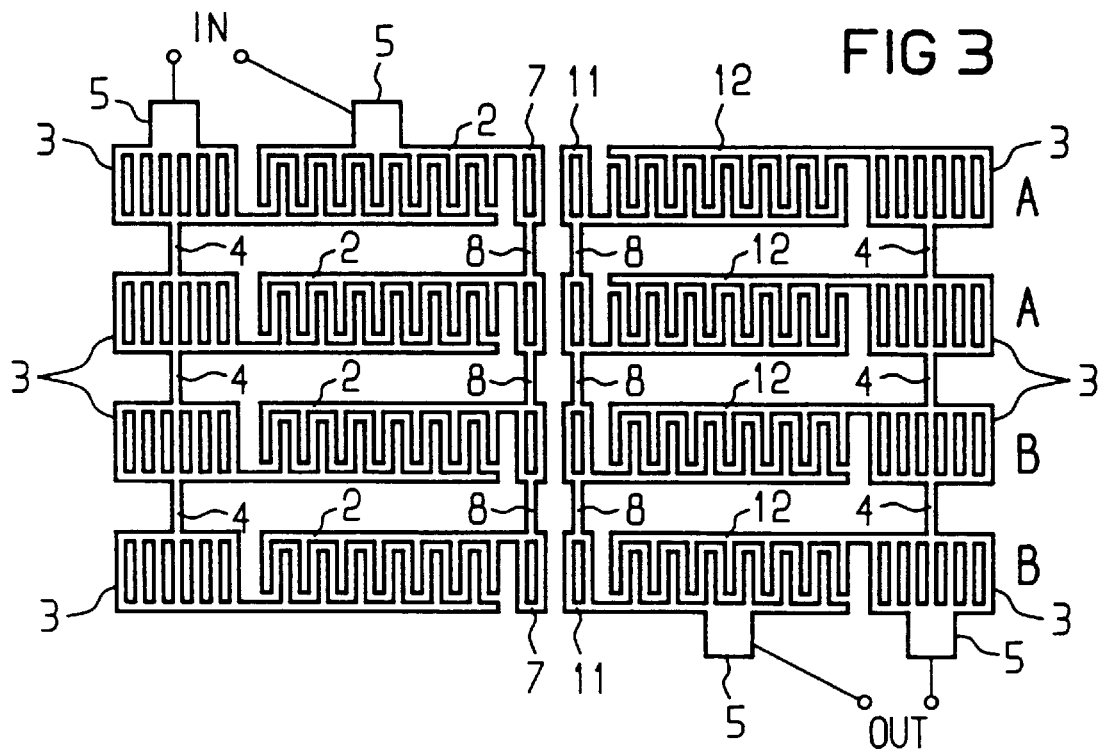
FIGS. 3–6 further embodiments of inventive twin dual mode filters in the illustration according to FIG. 2.

FIG. 2 shows a twin dual mode filter that has two DMS filters interconnected via interconnects 4 that comprise two normal finger transducers within reflectors 3, 3 effective as input or, respectively, output transducer 2 or, respectively, 12 per DMS track A, B. The DMS tracks A and B are frequency-shifted relative to one another such that the high-frequency resonance of the low-frequency track B calls onto the low-frequency resonance of the high-frequency track A. Suitable short reflectors 7, 11 that are respectively interconnected with one of the transducers 2 or, respectively, 12 are respectively arranged between input and output transducer 2 or, respectively, 12 of each DMS track A or, respectively, B. The reflectors of the input and output sides are respectively electrically connected to one another via interconnects 8, 8.

As a result of these reflectors and their interconnection with one another, the bond pads 5 can be relocated to the outside of the filter structure and, thus, a layout free of crossings can be obtained.

Both in this as well as in all other embodiments of the invention, the reflectors 7, 11 can be replaced by fingers having a suitable width.

Low impedances can be achieved by circuiting a plurality of DMS track pairs A, B parallel without the occurrence of disturbing transferse [sic] modes. For example, by connecting two twin dual mode filters in parallel according to FIG. 3, a halving of the impedance is thus obtained.

Figure 4:
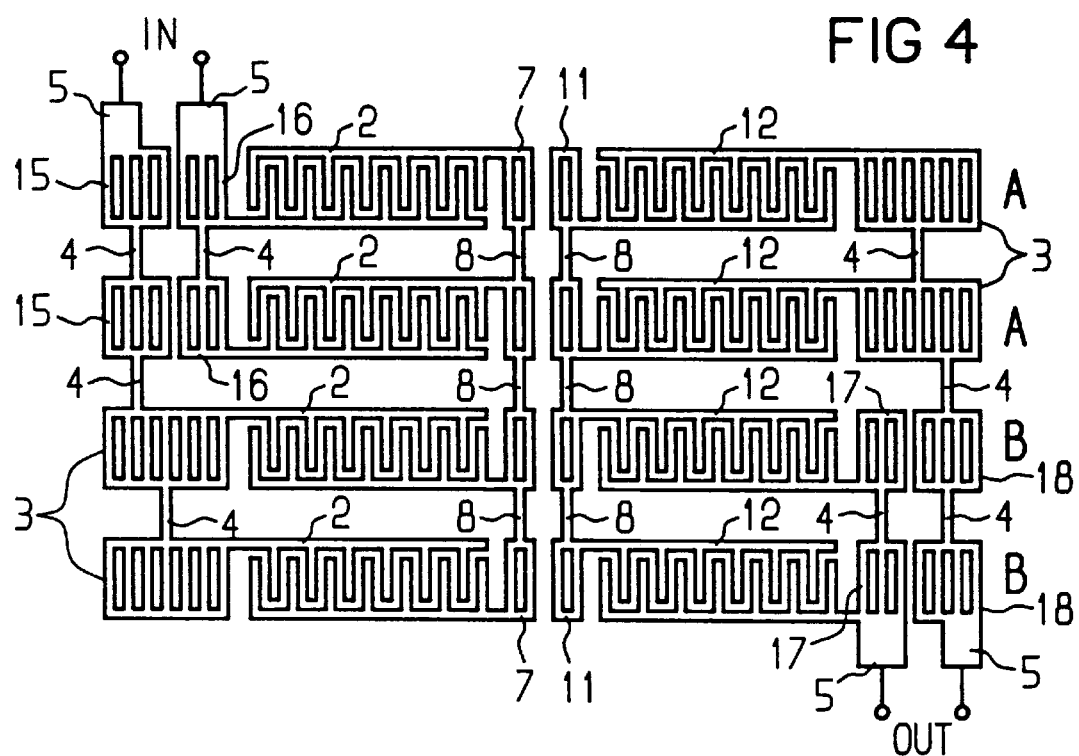

According to FIG. 4, for example, a balancing of the filter geometry as required for optimum suppression of the electrical crosstalk given symmetrical operation is achieved by a series circuit of two twin dual mode filters. The input-side reflectors 3 of the DMS tracks A and the output-side reflectors 3 of the DMS tracks B are thereby separated according to FIG. 3 into voltaically decoupled reflectors 15, 16 or, respectively, 17, 18.

As a result of the series circuit, a doubling of the input impedance is also achieved given simultaneous halving of the static filter capacitance. This filter, moreover, can also be asymmetrically operated.

Figure 5:
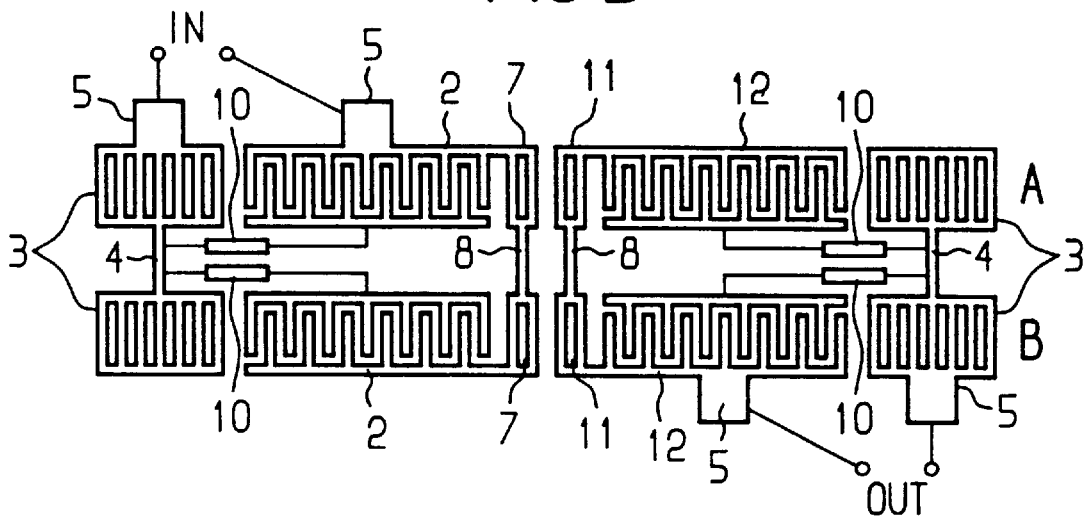

As already mentioned, increased group running time distortions in the filter transmission band caused by de-adjustment of the DMS tracks A, B are produced by interaction of the nearly identical resonances of the two DMS tracks A, B. These resonance effects can be diminished when the qualities of the resonances are reduced. Accepting an increase of the insertion attenuation, the qualities can be deteriorated according to FIG. 5, for example, in that ohmic resistors 10 are inserted into the leads to the input and output transducers 2 or, respectively, 12.

Figure 6:
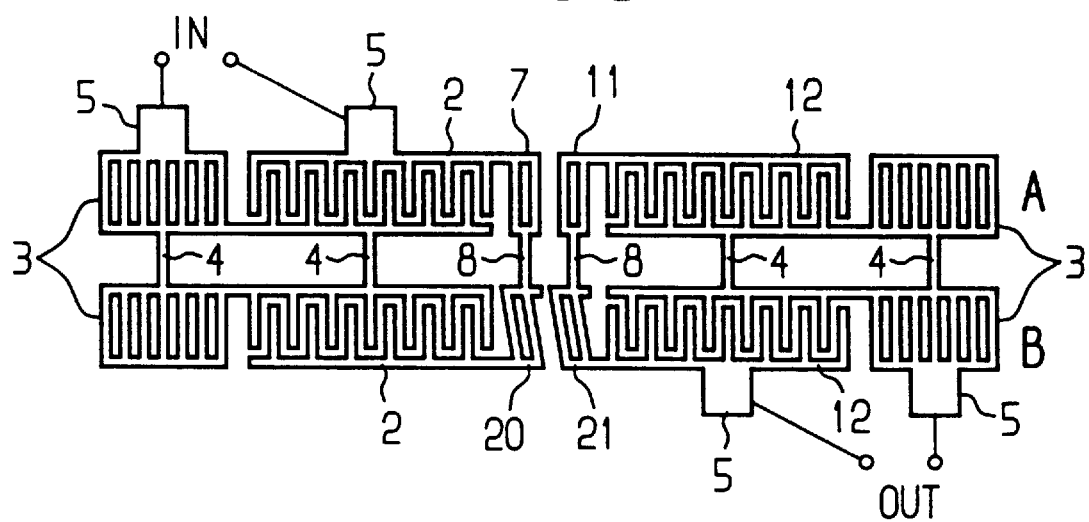

Conditioned by the design, the high-frequency resonance has a clearly higher quality than the low-frequency resonance given twin dual mode filters. Given maladjustments in the twin dual mode filter, the group running time distortions can also be reduced in that the quality of the high-frequency resonance of the low-frequency DMS track B is intentionally reduced. As shown in FIG. 6, this can be inventively achieved in that two reflectors 20, 21 respectively connected to one of these transducers and having fingers inclined or, respectively, placed at a slant relative to the propagation direction of the surface waves are arranged between input and output transducer 2 or, respectively, 12 of the low-frequency DMS track B. As a result of their slanting attitude, a small part of the acoustic power passing through these reflectors is reflected out of the acoustic track, for example into a wave sink.

The low-frequency resonance arises in the input transducer 2. The acoustic wave passes through the obliquely placed reflectors only once, whereby it is only weakly damped. Given the high-frequency resonance, by contrast, the acoustic wave is reflected back and forth between input and output transducer 2 or, respectively, 12 many times, i.e. that is passes through the reflectors 20, 21 very often and is thereby highly damped.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A twin dual mode filter having an input side and an output side, comprising:

two interconnected DMS filters having DMS tracks and having two normal finger transducers as input or, respectively, output transducers per DMS track within reflectors, the DMS tracks being frequency-shifted relative to one another such that a high-frequency resonance of a low-frequency track falls onto a low-frequency resonance of a high-frequency track;

two reflectors respectively interconnected with one of the transducers and arranged between the input and output transducers of each DMS track the reflectors of the input side or, respectively, output side being respectively electrically connected to one another via interconnects.

2. The twin dual mode filter according to claim 1, wherein the reflectors are fingers having a predetermined width.

3. The twin dual mode filter according to claim 1, wherein two twin dual mode filters are connected in parallel.

4. The twin dual mode filter according to claim 1, wherein two twin dual mode filters have series-connected outputs.

5. The twin dual mode filter according to claim 1, wherein two twin dual mode filters have inputs connected in series and outputs connected parallel.

6. The twin dual mode filter according to claim 1, wherein ohmic resistors are respectively connected into leads to the input and output transducers.

7. The twin dual mode filter according to claim 1, wherein two reflectors respectively interconnected with one of the input and output transducers and arranged between input transducer and output transducer of the low-frequency track have fingers inclined relative to a propagation direction of surface waves in the filters.

8. The twin dual mode filter according to claim 1, wherein terminal elements of a filter input and a filter output of the filter are applied intersection-free onto substrate surfaces of the DMS tracks facing away from one another.

9. A twin dual mode filter system comprising:

first and second twin dual mode filters, each of said filters having two interconnected DMS filters having DMS tracks and having two normal finger transducers as input or, respectively, output transducers per DMS track, the DMS tracks being frequency-shifted relative to one another such that a high-frequency resonance of a low-frequency track falls onto a low-frequency resonance of a high-frequency track;

two reflectors respectively interconnected with one of the transducers and arranged between the input and output transducers of each DMS track, the reflectors of the input side, or, respectively, output side being respectively electrically connected to one another via interconnects.

10. The twin dual mode filter system according to claim 9, wherein the reflectors are fingers having a suitable width.

11. The twin dual mode filter system according to claim 9, wherein the two twin dual mode filters are connected in parallel.

12. The twin dual mode filter system according to claim 9, wherein the two twin dual mode filters have series-connected outputs.

13. The twin dual mode filter system according to claim 9, wherein the two twin dual mode filters have inputs connected in series and outputs connected in parallel.

14. The twin dual mode filter system according to claim 9, wherein ohmic resistors are connected into leads to the input and output transducers.

15. The twin dual mode filter according to claim 9, wherein two reflectors respectively interconnected with one of the transducers and arranged between input and output transducers of the low-frequency DMS track have fingers inclined relative to the propagation direction of the surface waves.

16. The twin dual mode filter system according to claim 9, wherein terminal elements of filter input and filter output of a respective twin dual mode filter are applied intersection-free onto substrate surfaces of the DMS tracks facing away from one another.

* * * * *